United States Patent [19]

Iwai et al.

[11] 4,327,476
[45] May 4, 1982

[54] METHOD OF MANUFACTURING SEMICONDUCTOR DEVICES

[75] Inventors: Hiroshi Iwai, Takaidonishi; Yoshio Nishi, Yokohama, both of Japan

[73] Assignee: Tokyo Shibaura Denki Kabushiki Kaisha, Japan

[21] Appl. No.: 211,188

[22] Filed: Nov. 28, 1980

[30] Foreign Application Priority Data

Dec. 7, 1979 [JP] Japan .................. 54/158978

[51] Int. Cl.³ .................. H01L 21/28; H01L 21/302
[52] U.S. Cl. ............................. 29/571; 29/580; 29/589; 29/590; 29/591; 148/175; 148/187; 156/662; 357/23; 357/51
[58] Field of Search .................. 29/591, 589, 590, 580, 29/571; 148/187, 175; 357/51, 23 VT; 156/662

[56] References Cited

U.S. PATENT DOCUMENTS

| 3,911,562 | 10/1975 | Youmans | 29/590 |
| 3,956,033 | 5/1976 | Roberson | 29/580 |
| 3,975,220 | 8/1976 | Quinn et al. | 148/187 |
| 3,975,221 | 8/1976 | Rodgers | 148/187 X |
| 3,998,673 | 12/1976 | Chow | 29/580 X |
| 4,075,045 | 2/1978 | Rideout | 148/187 X |
| 4,094,057 | 6/1978 | Bhattacharyya et al. | 148/1.5 X |
| 4,102,714 | 7/1978 | DeBar et al. | 29/580 X |
| 4,104,086 | 8/1978 | Bondur et al. | 29/580 X |
| 4,125,933 | 11/1978 | Baldwin et al. | 29/577 C |
| 4,131,983 | 1/1979 | Matzen | 29/571 |

FOREIGN PATENT DOCUMENTS 53-32684  3/1978  Japan .

OTHER PUBLICATIONS

1978 IEEE International Solid-State Circuit Conference Digest of Technical Papers, p. 156, "VMOS Dynamic RAM", K. Hoffmann, R. Loshand, and K. Zarp.

*Primary Examiner*—G. Ozaki
*Attorney, Agent, or Firm*—Finnegan, Henderson, Farabow, Garrett & Dunner

[57] ABSTRACT

A method of manufacturing semiconductor devices is disclosed which comprises the steps of: forming at least one groove at a given location of a semiconductor substrate; laying an insulating film over the entire surface of the semiconductor substrate including the groove; depositing conductive material on the insulating layer to a thickness greater than half the width of an opening of the groove; and forming a MOS capacitor electrode of the conductor layer left in the groove by etching the deposited conductor layer until the insulating film other than its portion within the groove is exposed.

11 Claims, 20 Drawing Figures

F I G. 3G
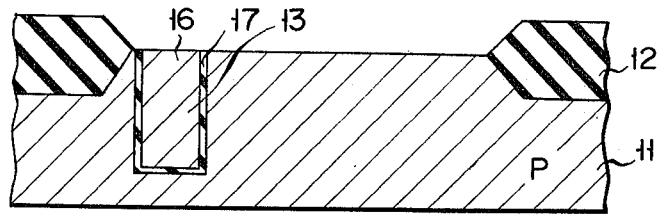
F I G. 3H
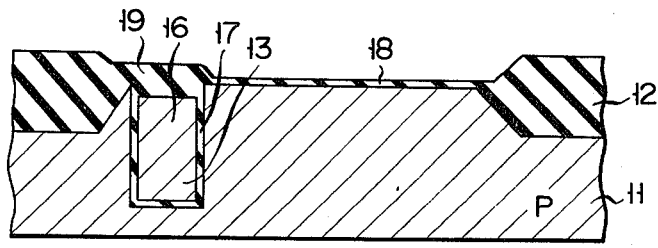
F I G. 3I
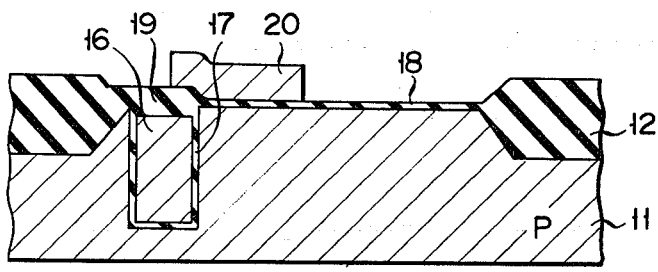
F I G. 3J
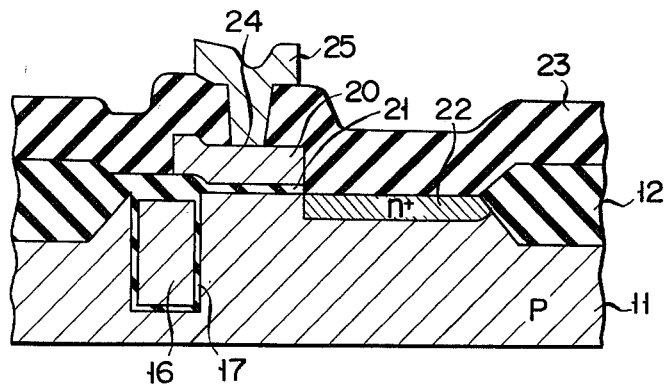

METHOD OF MANUFACTURING SEMICONDUCTOR DEVICES

BACKGROUND OF THE INVENTION

The invention relates to a method of manufacturing a semiconductor device with MOS capacitors and, more particularly, to an improvement of a MOS capacitor manufacturing method.

Because of a demand of high integration of semiconductor integrated circuit, it has recently been attempted to reduce the element size. In a MOS dynamic RAM (random access memory) in which a MOS capacitor to store data is formed by laying a capacitor electrode 3 on a main surface of a semiconductor substrate 1 with an insulating film 2 interposing therebetween, as shown in FIG. 1, the integration of the integrated circuit may be improved by reduction of an area of the capacitor electrode 3. However, when the electrode 3 area is reduced, the number of charges stored in the capacitor is decreased to a lower noise margin. There are proposed the following two methods to solve this defect:

(1) To increase the capacity of the MOS capacitor by thinning the insulating film.
(2) To increase the capacity of the MOS capacitor by using an insulating film with a dielectric constant larger than that of an $SiO_2$ film conventionally used for the insulating film. Such a large dielectric constant film is, for example, an $Si_3N_4$ film.

Either method has a problem. The film used has a low breakdown voltage and a low quality (e.g. presence of pin holes). Therefore, there is a limit in making the capacitor electrode area small.

There is another method to increase the capacity of the MOS capacitor, which is known as concaved MOS capacitor method (or VMOS capacitor method). In this method, a V-shaped concaved part 4 is formed in a semiconductor substrate 1 and a capacitor electrode 6 is formed in the concaved part 4 through an insulating film 5, as shown in FIG. 1. According to this method, the effective area of the MOS capacitor may properly be selected by changing the depth or shape of the concaved part 4. Further, there arises no problem mentioned above. In forming the concaved MOS capacitor by the method, however, it is difficult to form the capacitor electrode 6, self-aligning with the concaved part 4. For this reason, margins A must be provided on both sides of the concaved part 4 for avoiding the misalignment in masking. The provision of the marginal portions interferes with reduction of the MOS capacitor and provides a serious problem in realizing high integration of the MOS dynamic RAM.

SUMMARY OF THE INVENTION

Accordingly, an object of the present invention is to provide a method for manufacturing a semiconductor device with the MOS capacitor which may self-align a MOS capacitor electrode in a proper depth with a groove, and is capable of increasing a capacity of a MOS capacitor and reducing an area of the capacitor electrode.

Another object of the present invention is to provide a method for manufacturing a MOS capacitor which is capable of self-aligning a MOS capacitor electrode in a proper depth with a groove.

According to the present invention, there is provided a method of manufacturing semiconductor devices which comprises the steps of: forming at least one groove at a given location of a semiconductor substrate; laying an insulating film over the entire surface of the semiconductor substrate including the groove; depositing conductive material on the insulating layer to a thickness greater than half the width of an opening of the groove; and forming a MOS capacitor electrode of the conductor layer left in the groove by etching the deposited conductor layer until the insulating film other than its portion within the groove is exposed.

Other objects and feature of the present invention will be apparent from the following description taken in connection with the accompanying drawings, in which:

BRIEF DESCRIPTION OF THE DRAWINGS

FIGS. 3A to 3J are series of cross sectional views useful in explaining a sequence of manufacturing steps of a MOS dynamic RAM according to Example 1 of the present invention;

DETAILED DESCRIPTION OF THE PREFERRED EMBODIMENTS

Figure 1:
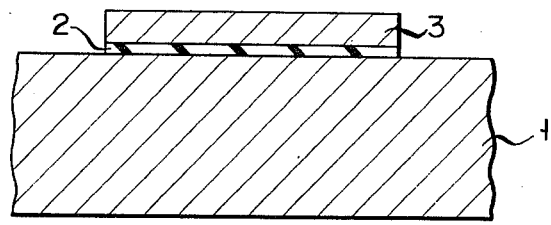
FIG. 1 is a cross sectional view of a conventional MOS capacitor.
Figure 2:
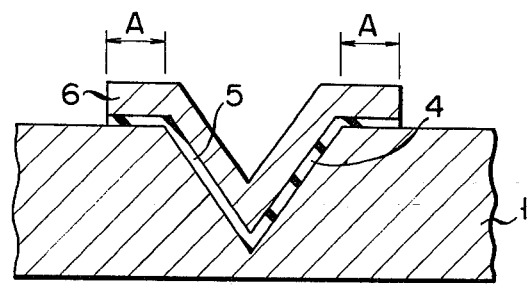
FIG. 2 is a cross sectional view of a conventional concaved MOS capacitor.

The present invention is based on a fact that when conductor material is deposited to a thickness greater than half the width of an opening of a groove formed in the surface region of a semiconductor substrate of which the surface is coated with an insulating film, the conductor material fills the groove at least up to the opening, and then when a deposited conductor layer is etched, the deposited conductor layer is left in the groove even if the deposited conductor layer on the insulating film in the region other than the groove region is removed. According to the present invention based on such a fact, the MOS capacitor electrode may be formed self-aligned, not formed by etching process using a mask pattern. The reason why the conductor material fills the groove at least up to the opening of the groove when the conductor material is deposited to the thickness greater than half the opening width of the groove, is that since the deposition of the conductor material has no directionality, the deposition of the conductor material progresses on also the side faces of the groove.

The present invention will be described in more detail. After a mask layer in which a portion where a groove is to be formed is removed, for example, a resist pattern or an insulating film pattern is laid on a semiconductor substrate, a portion exposed through the mask layer is etched to a desired depth to form a groove. When the reactive ion etching or ion etching is used for the etching technique, the groove of which the side face is substantially vertical may be formed. Another etching process may also be employed. In this case, the side face of the groove is tapered or inversely tapered. The number of the groove is not limited to one but may be two or more.

If grooves of different depths are cut and MOS capacitors are formed in them, the capacitors will of course have different capacitances.

After the mask layer is removed, an insulating film is laid over an entire surface of the semiconductor substrate including the groove. In this case, the groove should not be fully filled with the insulating film. The side and bottom faces of the groove is coated with the thin insulating film. The method to form an oxide film by the thermal oxidation process or the method to form a $SiO_2$ film or a $Si_3N_4$ film by the CVD (chemical vapor deposition) or sputtering may be employed for forming the insulating film.

In the next step, conductor material is deposited to a thickness greater than half the width of the opening of the groove and fills the groove up to the opening of the groove. If the conductor material is deposited to a thickness less than half the opening width of the groove, a concave part is formed in the groove and in the process of etching, the conductor material in the groove to be used as the MOS capacitor electrode is etched. The conductor material may be: polysilicon, poly-silicon doped with impurity such as phosphorus, arsenic or boron; refractory metal such as molybdenum, tungsten, titanium and platinum, or refractory metal silicide such as molybdenum silicide, tungsten silicide and platinum silicide.

Then, the conductor layer is etched until the insulating film layered on a region other than the groove region is exposed.

As a result, the conductor layer is left in the groove. Thereafter the known steps for manufacturing a semiconductor device are carried out to provide a device having a MOS capacitor whose electrode is made by said conductor layer. A MOS dynamic RAM is an example of such a semiconductor device. A dry etching process using plasma or a wet etching process using etching solution may be used for removing the conductor layer. This etching is an entire surface etching not using any mask.

The example as mentioned above is an example of a MOS capacitor by using the entire etching of the conductor layer without the mask. Alternatively, in removing the conductor layer by etching, not only the conductor layer within the groove but also the conductor layer outside the groove is partially left, whereby an interconnection layer and/or gate electrode, together with the MOS capacitor layer, may simultaneously be formed.

Specifically, a mask is laid on that portion of the conductor layer which will be an interconnection layer to cover the groove in part and/or that portion of the conductor layer which will be a gate electrode not to cover the groove. The conductor layer is etched away until the insulating layer other than its mask layer and groove portions are exposed. After the etching process, the conductor layer is left not only in the groove but also under the mask layer. As a result, the interconnection layer integrally connected to the MOS capacitor electrode and/or the gate electrode are simultaneously formed together with the MOS capacitor electrode.

Examples in which the present invention is applied for the manufacturing MOS dynamic RAMs will be described referring to the accompanying drawings.

EXAMPLE 1

Figure 3A:
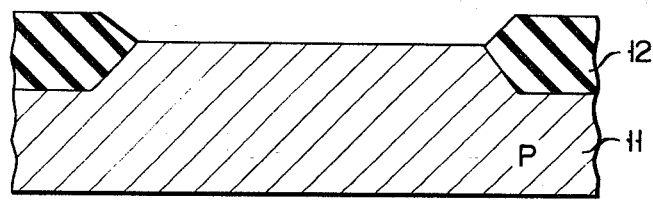
Figure 3B:
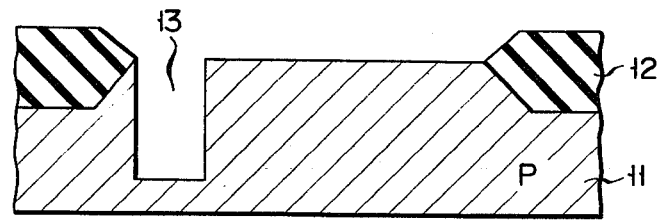

Firstly, as shown in FIG. 3A, a field oxidation film 12 for separating elements is formed on a p-type substrate 11 by a selective oxidation process. Then, a groove 1 $\mu m$ in width, 3 $\mu m$ in length, and 2.5 $\mu m$ in depth is formed in an element region of the silicon substrate 11 by a photoetching process using sputter ion etching, as shown in FIG. 3B.

If necessary, a resist film is laid on the surface of the substrate and ions of an n-type or p-type impurity are then implanted on the bottom of the groove, thereby forming an impurity region. Alternatively, ions of the impurity are implanted not only on the bottom of the groove but also on the sides of the groove.

Figure 3C:
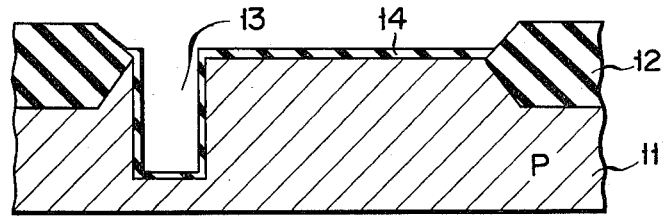
Figure 3D:
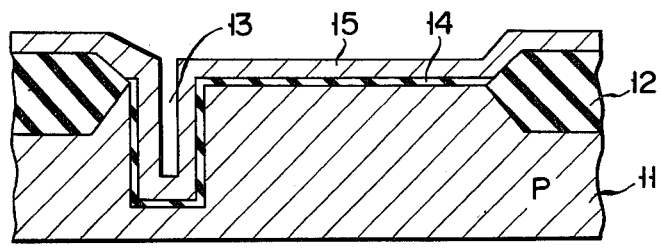
Figure 3E:
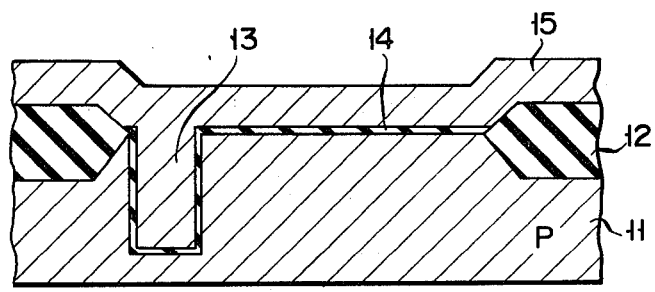

In the next step, those are subjected to a thermal oxidation process in dry oxygen atmosphere at 1,000° C. At this step, as shown in FIG. 3C, a thermal oxidation layer 14 of 300 Å in thickness is grown over an entire surface of the silicon substrate 11 including the groove 13. Subsequently, a phosphorus doped poly-silicon layer of 6,000 Å in thickness is deposited by the CVD or sputtering method as shown in FIG. 3E. In this step, the phosphorus doped poly-silicon layer 15 is deposited over the silicon substrate 11 and fills the groove 13 up to the opening of 1 $\mu m$ in width.

The phosphorus doped poly-silicon layer 15 has a substantially uniform thickness, the portion laying on the bottom of the groove 13 and the portions laying on the sides of the groove 13 alike. FIG. 3D illustrates the layer 15 being formed not completed yet.

Figure 3F:
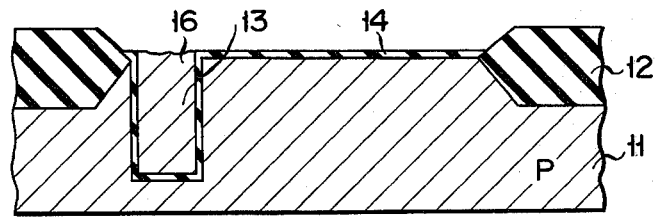

Then, the phosphorus or arsenic doped poly-silicon layer 15 is etched by plasma etching or by etching solution of hydrofluoric series until that the thermal oxidation layer 14 except the groove 13 is exposed, so that the phosphorus or arsenic doped polysilicon within the groove 13 is left therein to form a capacitor electrode 16 within the groove 13, as shown in FIG. 3F. In the following step, the thermal oxidation film 14 on the silicon substrate 11 is selectively etched away with a mask of the capacitor electrode 16 thereby to form an insulating layer 17 for a capacitor 17 by the thermal oxidation layer within the groove 13 is left, as shown in FIG. 3G.

Following this step, it is thermal oxidized in dry oxygen atmosphere at 1,000° C. Through this thermal oxidation process, a thermal oxide layer 18 of 750 Å in thickness was grown on the exposed surface of the silicon substrate 11 and a thick oxide layer 19 of about 1,200 Å was grown on the capacitor electrode 16 since phosphorus is contained in the capacitor electrode 16, as shown in FIG. 3H. In the following step, a poly-silicon layer to be used as a gate electrode is deposited and is patterned to form a gate electrode 20 and a transfer gate, as shown in FIG. 3I. The thermal oxide layer was selectively etched with a mask of the gate electrode 20 to form a gate insulating layer 21 and arsenic is diffused into the silicon substrate 11 to form an $n^+$ diffusion layer 22 serving as a digit line. Then, a low temperature oxide layer 23 was deposited over an entire surface of the structure and a contact hole 24 was formed in the low temperature oxide layer 23. An Al lead 25 was then formed in the contact hole 24. In this way, a MOS dynamic RAM was manufactured, as shown in FIG. 3J.

According to an Example 1, the phosphorus doped poly-silicon was left in the groove 13 alone and the capacitor electrode 16 could be formed in the groove 13 while being self-aligned with latter. There is no need for the marginal region in preparation for the misalignment of the groove 13 with the capacitor electrode 16. At this point, the reduction of the MOS capacitor and the high integration of the MOS dynamic RAM were attained. The MOS capacitor of the MOS dynamic RAM formed had the following dimensions: the width and depth of the groove were 1 μm and 2.5 μm, an area around the groove 13 was 23 μm², and the thickness of the insulating layer 17 was 300 Å. The capacitance of the capacitor had a sufficiently high value, approximately 27 pF.

Figure 4:
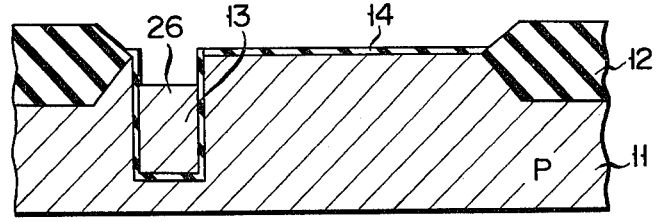
FIG. 4 is a cross sectional view of a MOS capacitor with a capacitor electrode over-etched.
Figure 5A:
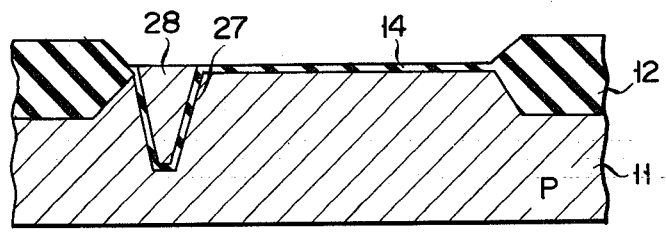
FIG. 5A is a cross sectional view of a MOS capacitor with a capacitor electrode of which the cross section is shaped V.

In the Example 1, the top of the capacitor electrode 16 was flush with the upper level of the substrate 11 as a result of the entire-surface etching. As shown in FIG. 4, the top face of the phosphorus doped poly-silicon 26 within the groove 13 may be made slightly lower than the upper face of the substrate by over-etching the phosphorus doped poly-silicon therein. For forming the groove 13, the Example 1 uses sputter etching to form the groove of which the side face is substantially vertical. Such shaped groove 13 may be formed by etching a silicon substrate with a crystal face (110) by KOH. The shape of the groove 13 is not limited to such one. For example, as shown in FIG. 5A, the groove 27 is shaped V in cross section with the side faces being slanted. The capacitor electrode 28 is formed in the V-shaped groove.

In this case, the relationship between the thickness t of the deposited layer and the angle θ at which the sides of the groove incline to the vertical line can be expressed by the following formula:

$$t \geq \frac{a}{2} \tan\left(45° + \frac{\theta}{2}\right)$$

a: width of the groove opening.

Figure 5B:
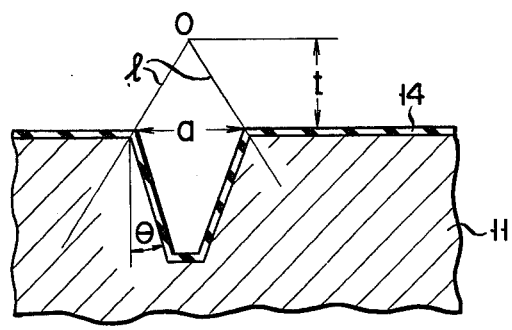
FIG. 5B shows the relationship between the thickness t of a layer deposited and the angle $\theta$ at which the sides of the groove incline to the vertical line.
Figure 6:
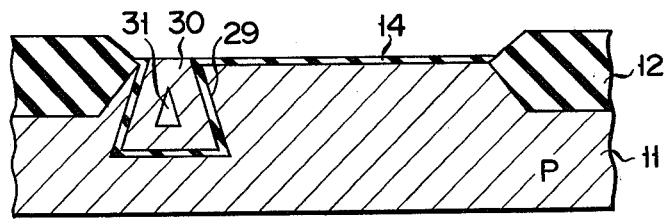
FIG. 6 is a cross section of a MOS capacitor with an inversely tapered capacitor electrode.
Figure 7:
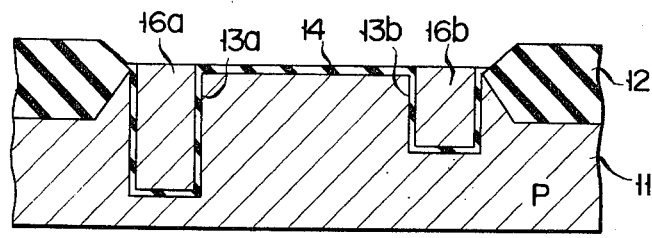
FIG. 7 is a cross sectional view of a MOS capacitor with two capacitor electrodes with different depths.

In FIG. 5B, o is an intersection of two lines 1 which divide the angle defined by the surface of the substrate 11 and inclined sides of the groove into two equal parts. A groove 29 of which the side faces are inversely tapered as shown in FIG. 6 is also allowable. The capacitor 30 is of course formed in the groove 29. In this case, a cavity 31 is formed in the groove 29. Such a shape of the groove 29 may be formed by using a proper etching process. The Example 1 forms a single capacitor electrode in the groove formed in the element region surrounded by the field oxide layer 12. However, an example shown in FIG. 7 is allowable in which two grooves 13a and 13b with different depths are formed and capacitor electrodes 16a and 16b are provided in those grooves 13a and 13b. The example of FIG. 7 forms two MOS capacitors with different capacitances on the same substrate.

EXAMPLE 2

Figure 8:
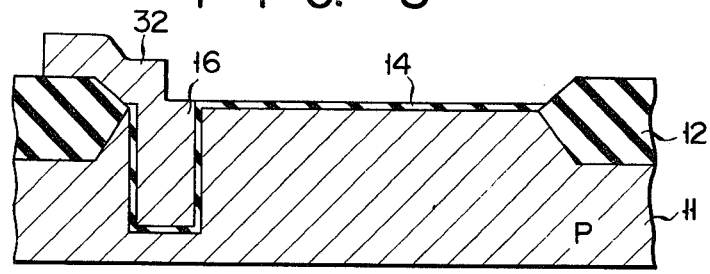
FIG. 8 is a cross sectional view of a MOS dynamic RAM according to Example 2 of the invention, not completed.

A thermal oxide layer 14 of 300 Å in thickness was grown on the silicon substrate 11 including the groove 13, as in the Example 1. Then, a phosphorus doped poly-silicon layer of 6,000 Å in thickness is deposited to fill the groove 13. An area of the phosphorus doped poly-silicon layer with the 6,000 Å thickness including a part of the groove 13 is coated with resist. Following this, the poly-silicon layer is entire-surface etched by plasma etching or by etchant of hydrofluoride series until the thermal oxide layer except its resist and groove portions is exposed thereby to form capacitor electrode 16 in the groove 13 and a lead wire 32 partially extending over the field oxide layer 12 and integral with the capacitor electrode 16 (FIG. 8). Subsequently, the n+ diffusion layer used as the digit line, the gate electrode and the Al wire through the low oxide layer are formed as in the Example 1, although those are not shown. In this way, a MOS dynamic RAM was manufactured.

In Example 2, the lead wire connected to the capacitor electrode may be formed simultaneously with the formation of the capacitor electrode. This feature simplifies the manufacturing process of the semi-conductor device. Further, the capacitor and the wire are made of the phosphorus doped poly-silicon formed by the same deposition. The reliability of the interconnection of them is considerably improved compared to that by the conventional manner using the contact hole.

EXAMPLE 3

Figure 9:
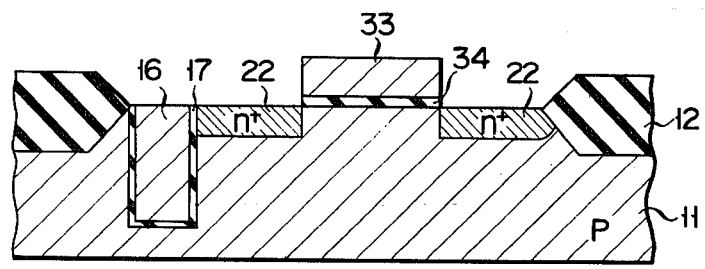
FIG. 9 is a cross sectional view of a MOS dynamic RAM according to Example 3 of the present invention, not completed.

The field oxide layer 12 was formed on the p-type silicon substrate 11 by the selective oxidation process. The groove 13 was formed in a desired location in the element region as in Example 1. The thermal oxide layer is then grown over the entire surface of the substrate 11 including the groove 13. After this process step, the phosphorus doped poly-silicon is deposited to the thickness of 3,000 Å by the CVD or sputtering method to fill the groove 13. After the phosphorus doped poly-silicon layer used as the gate electrode except its groove portion, is coated with resist, it is entire-surface etched till the thermal oxide layer other than its resist and groove portions of the thermal oxide layer is exposed, thereby to form the capacitor electrode 16 in the groove 13 and to form the gate electrode 33 on the substrate 11 except the groove 13 portion of the substrate. By using the capacitor electrode 16 and the gate electrode 33 as a mask, the thermal oxide layer is selectively etched to form the insulating layer 17 and the gate insulating layer 34 of the MOS capacitor. Subsequently, the n+ diffusion layers 22 and 22 used as the digit lines were formed by the ion implantation of arsenic (FIG. 9). Then, the Al wire is formed through the low temperature oxide layer. Through these steps of manufacturing process, a MOS dynamic RAM was manufactured.

The Example 3 may form the capacitor electrode within the groove and the gate electrode on the substrate except its groove portion in a simultaneous manner. This feature simplifies the manufacturing steps of the semiconductor device.

EXAMPLE 4

Figure 10:
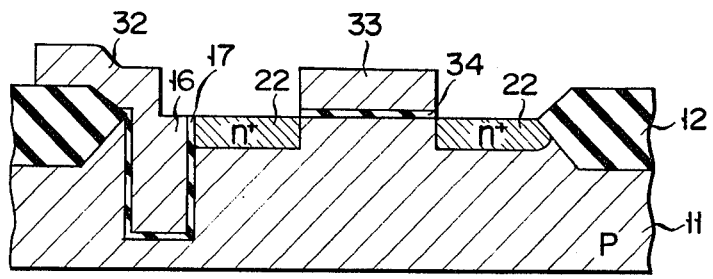
FIG. 10 is a cross sectional view of a MOS dynamic RAM according to Example 4 of the present invention, not completed.

As in Example 1, the thermal oxide layer 14 with the 300 Å thickness is grown on the silicon substrate including the groove 13. Then, the phosphorus doped polycrystalline silicon of 6,000 Å in thickness is deposited to fill the groove 13. Then, a portion of the poly-silicon layer including a part of the groove 13 and another portion of the poly-silicon layer are covered with resist and then the semiproduct of the semiconductor device is entire-surface etched till the thermal oxide layer except its resist and groove portions is exposed thereby to form the capacitor 16 in the groove 13, the wire 32 partially extending over the field oxide layer 12 and integral with the capacitor electrode 16, and the gate electrode 33 on the substrate except its groove portion. Next, the insulating layer 17 for the MOS capacitor and the gate insulating layer 34 were formed by etching the thermal oxide layer with a mask of the capacitor electrode 16 and the gate electrode 33. Next, the n+ diffusion layer as the digit line was formed (FIG. 10) by ion implanting arsenic. Although not shown, the Al wire is provided through the low temperature oxide layer as in the Example 1. In this manner, a MOS dynamic RAM was fabricated.

The Example 4 simultaneously forms the capacitor electrode 16 in the groove 13, the lead wire 32 leading to the capacitor electrode 16 and a gate electrode 33 on the substrate 11 except its groove portion. Therefore, the manufacturing process is considerably simplified.

As described above, the present invention may form the capacitor electrode in the groove in a proper depth in a self-aligning manner without any margin for the mask registration. Therefore, the invention successfully attains the capacitance increase of the MOS capacitor, the reduction of the capacitor electrode thereby to provide semiconductor devices with high integration and reliability.

Further, the present invention simultaneously forms the capacitor electrode in the groove in the self-aligning manner through the simplified process, the wire integral with the capacitor electrode disposed outside the groove portion and the gate electrode disposed on the substrate. Therefore, the interconnection of the MOS capacitor with the wire in the semiconductor device fabricated by the present invention is greatly reliable. This feature also contributes to high integration and reliable semiconductor devices production.

What we claim is:

1. A method of manufacturing semiconductor devices comprising the steps of:
    forming at least one groove at a given location of a semiconductor substrate;
    laying an insulating film over the entire surface of said semiconductor substrate including said groove;
    depositing conductive material on said insulating layer to a thickness greater than half the width of an opening of said groove; and
    forming a MOS capacitor electrode of the conductor layer residual in said groove by etching said deposited conductor layer until the insulating film other than its portion within said groove is exposed.

2. A method according to claim 1, wherein said groove has substantially vertical side faces.

3. A method according to claim 2, wherein said groove is formed by forming a mask with a given pattern on said semiconductor substrate and etching away given part of said semiconductor substrate through said mask layer by the reactive ion etching process.

4. A method according to claim 1, wherein said groove is shaped V in cross section.

5. A method according to claim 4, wherein the thickness of said deposited conductor layer satisfied the following formula:

$$t \geq \frac{a}{2} \tan\left(45° + \frac{\theta}{2}\right)$$

where
    t: the thickness of the deposited conductor layer,
    a: width of the groove opening,
    $\theta$: the angle (°) at which the sides of the groove incline to the vertical line.

6. A method according to claim 1, wherein said groove is shaped inversely tapered.

7. A method according to claim 1, wherein said conductor layer within said groove is over-etched lower than the upper face of the substrate.

8. A method according to claim 1, wherein said groove includes two grooves with different depths.

9. A method according to claim 1, further comprising the step for forming a mask layer on that portion of said conductor layer which will be an interconnection layer to cover said groove in part.

10. A method according to claim 1, further comprising the step for forming a mask layer on that portion of said conductor layer which will be a gate electrode not to cover the groove.

11. A method according to claim 1, further comprising the step for forming a mask layer on that portion of said conductor layer which will be an interconnection layer to cover the groove in part and that portion of the conductor layer which will be a gate electrode not to cover the groove.

* * * * *